United States Patent
Kim

(10) Patent No.: US 9,457,369 B2
(45) Date of Patent: Oct. 4, 2016

(54) ORGANIC LIGHT-EMITTING DISPLAY APPARATUS AND DEPOSITION MASK FOR THE APPARATUS

(71) Applicant: Samsung Display Co., Ltd., Yongin (KR)

(72) Inventor: Kwangmin Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/661,005

(22) Filed: Mar. 18, 2015

(65) Prior Publication Data

US 2016/0093834 A1    Mar. 31, 2016

(30) Foreign Application Priority Data

Sep. 29, 2014    (KR) .................. 10-2014-0130338

(51) Int. Cl.
   *B05B 15/04*    (2006.01)
   *H01L 27/32*    (2006.01)

(52) U.S. Cl.
   CPC ......... *B05B 15/045* (2013.01); *H01L 27/3218* (2013.01); *H01L 27/3223* (2013.01)

(58) Field of Classification Search
   CPC .................................................. H01L 51/56
   See application file for complete search history.

(56) References Cited

U.S. PATENT DOCUMENTS

| | | | |
|---|---|---|---|
| 2003/0030766 A1* | 2/2003 | Kiguchi | G02B 5/201 349/106 |
| 2003/0146694 A1* | 8/2003 | Lee | H01L 27/3223 313/505 |
| 2004/0218127 A1* | 11/2004 | Miura | G02F 1/1333 349/122 |
| 2005/0260335 A1* | 11/2005 | Kimura | H01L 27/3211 427/58 |
| 2008/0018236 A1 | 1/2008 | Arai et al. | |
| 2013/0174780 A1 | 7/2013 | You et al. | |
| 2013/0256648 A1* | 10/2013 | Nakatani | H01L 27/3223 257/40 |

FOREIGN PATENT DOCUMENTS

| | | |
|---|---|---|
| KR | 10-2005-0083422 | 8/2005 |
| KR | 10-2009-0046640 | 5/2009 |
| KR | 10-2010-0101436 | 9/2010 |
| KR | 10-2013-0081528 | 7/2013 |

* cited by examiner

*Primary Examiner* — Lex Malsawma
(74) *Attorney, Agent, or Firm* — H.C. Park & Associates, PLC

(57) ABSTRACT

An organic light-emitting display apparatus including: a substrate including a light emission area and a non-emission area disposed in an outer portion adjacent the light emission area; a plurality of subpixels disposed in the light emission area of the substrate and including a first electrode, a emission layer, and a second electrode, wherein the plurality of subpixels respectively emit light of different colors; and a plurality of dummy emission layers that are disposed in a non-emission area of the substrate and are of different colors. A first distance between adjacent dummy emission layers of a first color, from among the plurality of dummy emission layers is smaller than a second distance between adjacent subpixels that emit light of the first color, from among the plurality of subpixels.

15 Claims, 8 Drawing Sheets

ORGANIC LIGHT-EMITTING DISPLAY APPARATUS AND DEPOSITION MASK FOR THE APPARATUS

CROSS-REFERENCE TO RELATED APPLICATION

This application claims priority from and the benefit of Korean Patent Application No. 10-2014-0130338, filed on Sep. 29, 2014, which is hereby incorporated by reference for all purposes as if fully set forth herein.

BACKGROUND

1. Field

Exemplary embodiments relate to an organic light-emitting display apparatus and a deposition mask for the organic light-emitting display apparatus.

2. Discussion of the Background

A display apparatus is an apparatus for displaying an image, and recently, an organic light-emitting diode display has been used as a display apparatus.

An organic light-emitting display apparatus is self-emissive, and does not require an additional light source, unlike a liquid crystal display device. Thus, an organic light-emitting display apparatus may advantageously be thin and lightweight. In addition, an organic light-emitting display device has beneficial qualities, such as low power consumption, high luminance, and a high response speed.

In order to manufacture a full-color organic light-emitting display device, a technique of depositing a red (R) emission layer, a green (G) emission layer, and a blue (B) emission layer independent of one another on a substrate by using a deposition mask may be used.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light-emitting display apparatus and a deposition mask for the organic light-emitting display apparatus.

Additional aspects will be set forth in part in the description which follows and, in part, will be apparent from the disclosure, or may be learned by practice of the inventive concept.

An exemplary embodiment of the present invention discloses an organic light-emitting display apparatus including: a substrate including a light emission area and a non-emission area disposed in an outer portion adjacent the light emission area; a plurality of subpixels disposed in the light emission area of the substrate and including a first electrode, an emission layer, and a second electrode, wherein the plurality of subpixels are configured to respectively emit light of different colors; and a plurality of dummy emission layers that are disposed in the non-emission area of the substrate and are of different colors. A first distance between adjacent dummy emission layers of a first color, from among the plurality of dummy emission layers, is smaller than a second distance between adjacent subpixels that emit light of the first color, from among the plurality of subpixels.

An exemplary embodiment of the present invention also discloses a deposition mask for manufacturing an organic light-emitting display apparatus including: a plurality of effective opening portions that correspond to a light emission area and are disposed in parallel to one another; and a plurality of dummy opening portions that correspond to a non-emission area included in an outer portion adjacent the light emission area and that are disposed in parallel to one another. A first distance between adjacent dummy opening portions from among the dummy opening portions is smaller than a second distance between adjacent effective opening portions from among the effective opening portions.

These general and specific embodiments may be implemented by using a system, a method, a computer program, or a combination of the system, the method, and the computer program.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
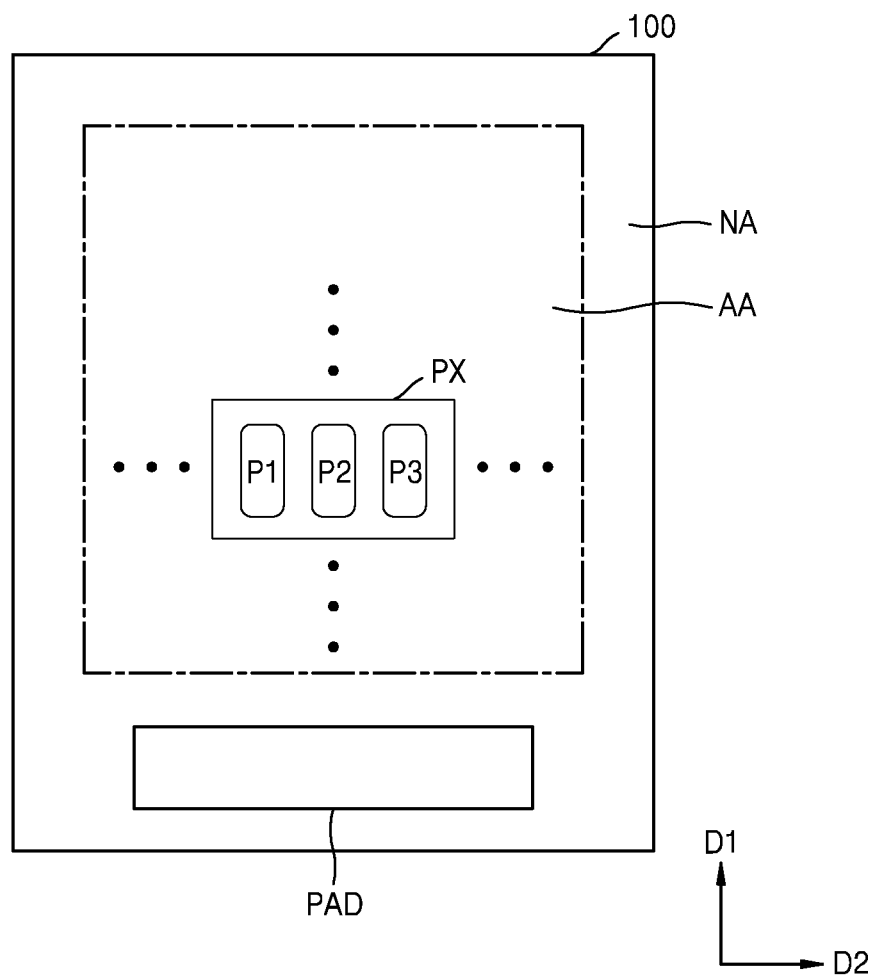
FIG. 1 is a plan view schematically illustrating an organic light-emitting display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

As used herein, the term "color" in reference to an emission layer or subpixel refers to the color emitted upon activation, not the color of the material itself. Thus, for dummy emission layers, "color" refers to the color that would be emitted if the material of the dummy emission layer were part of an activated subpixel.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

FIG. 1 is a plan view schematically illustrating an organic light-emitting display apparatus according to an exemplary embodiment.

Referring to FIG. 1, the organic light-emitting display apparatus includes a substrate 100 on which a plurality of pixels PX are formed. The substrate 100 may be a low temperature polycrystaline silicon (LTPS) substrate, a glass substrate, or a plastic substrate.

Although not illustrated, exemplary embodiments of the organic light-emitting display apparatus may include an encapsulation substrate that is adhered thereto by sealing. The encapsulation substrate blocks external moisture or air from contact with the plurality of pixels PX, and is disposed to face the substrate 100. The encapsulation substrate may be a glass substrate, a plastic substrate, or a stainless using steel (SUS) substrate, and the substrate 100 and the encapsulation substrate may be bonded to each other via a sealing member (not shown) that is disposed along edges of the substrate 100 and the encapsulation substrate. According to another exemplary embodiment, a thin film encapsulation film (not shown) may be formed on the substrate 100 instead of the encapsulation substrate to thereby protect the pixels PX. The thin film encapsulation film may have a structure in which a layer formed of an inorganic material, such as a silicon oxide or a silicon nitride, and a layer formed of an organic material, such as an epoxy or polyimide, are alternately stacked, but is not limited thereto.

The substrate 100 includes a light emission area AA from which light is emitted, and a non-emission area NA disposed in an outer portion adjacent the light emission area AA.

A plurality of pixels PX are disposed in the light emission area AA of the substrate 100. The pixels PX may be unit pixels including a plurality of subpixels P1, P2, and P3 that emit different colors of light. For example, a pixel PX may be a unit pixel that includes a red subpixel P1, a green subpixel P2, and a blue subpixel P3. While a pixel PX including a red subpixel P1, a green subpixel P2, and a blue subpixel P3, is described in the present exemplary embodiment, the pixel PX may further include, for example, a white subpixel.

The non-emission area NA of the substrate 100 may include driving circuit units (not shown) that drive the light emission area AA and a pad electrode PAD that extend from the wiring of the light emission area AA.

Hereinafter, structures of the light emission area AA and the non-emission area NA of the organic light-emitting display apparatus according to embodiments will be described in detail with reference to FIGS. 2A, 2B, and 3.

Figure 2A:
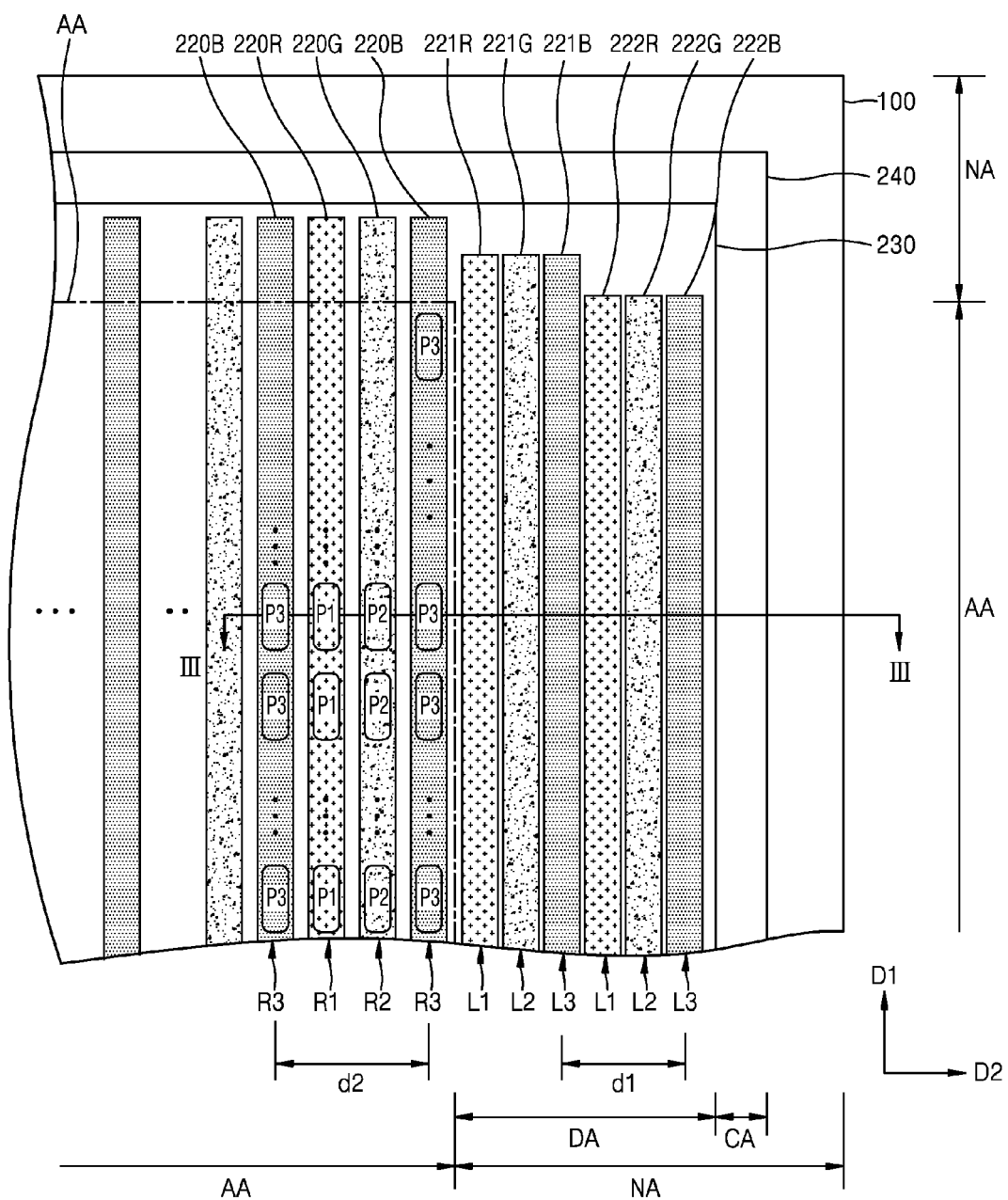
FIG. 2A is a plan view illustrating a portion of an organic light-emitting display apparatus according to an exemplary embodiment.
Figure 2B:
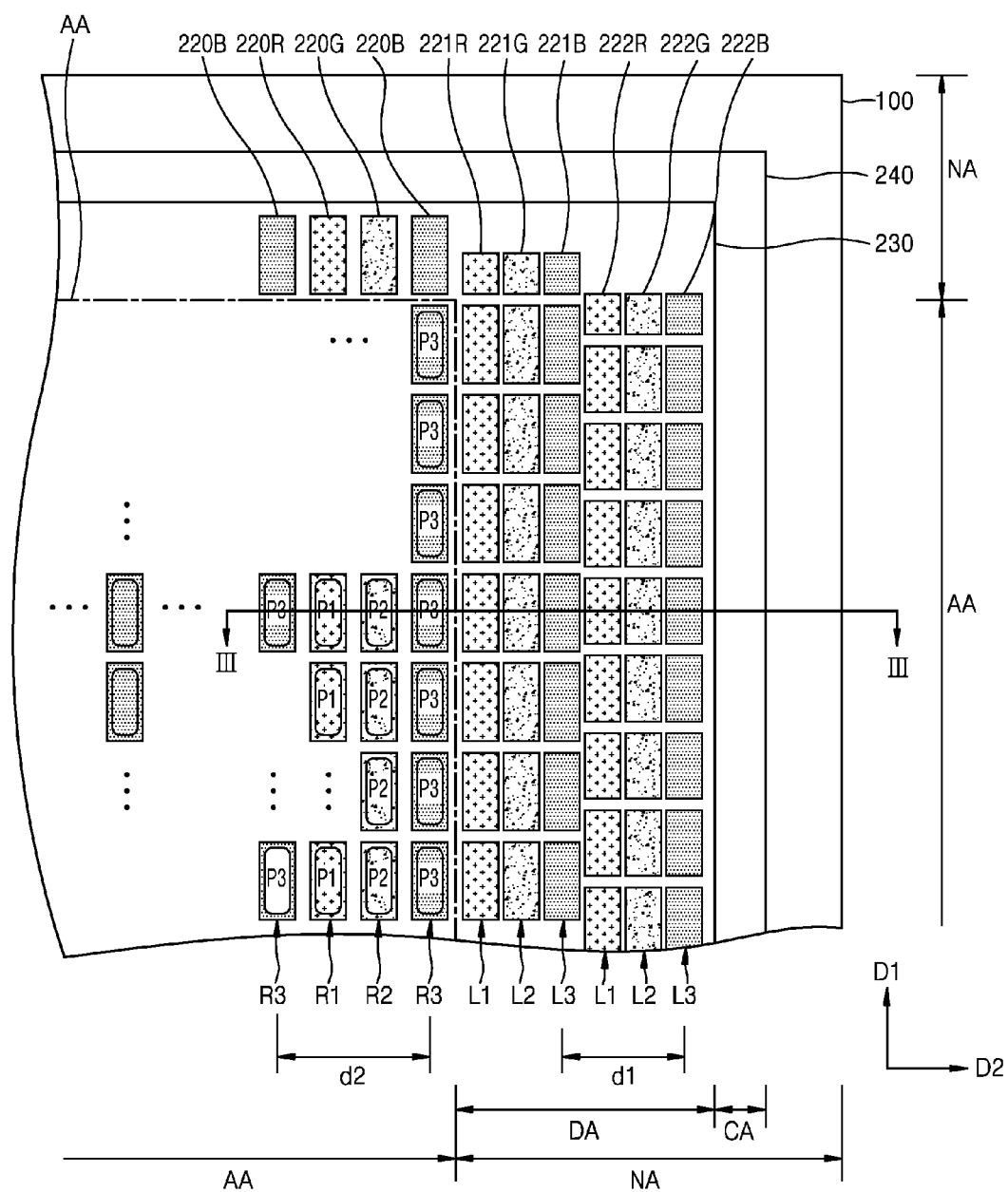
FIG. 2B is a plan view illustrating a portion of an organic light-emitting display apparatus according to another exemplary embodiment.
Figure 3:
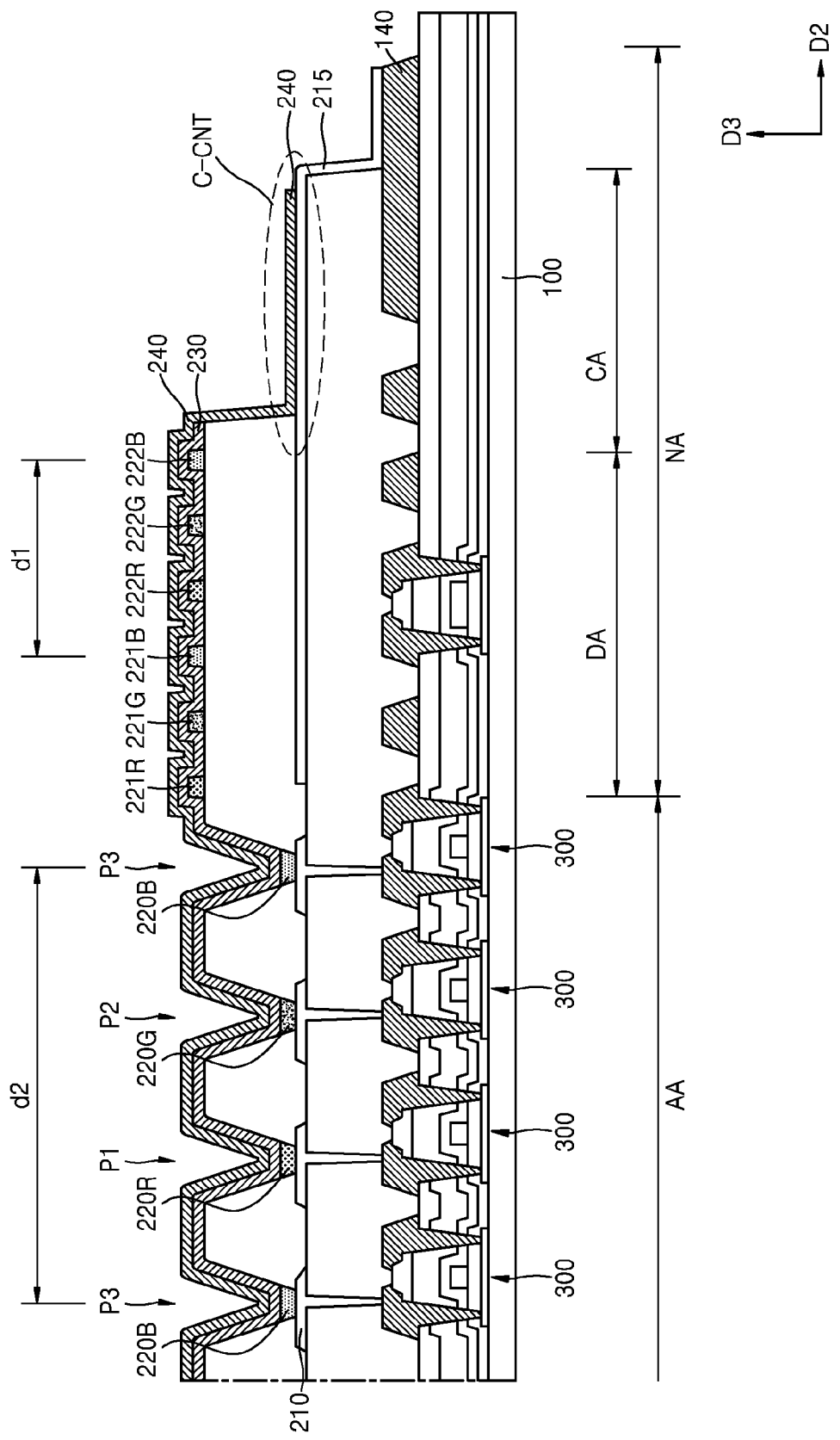
FIG. 3 is a cross-sectional view of the organic light-emitting display apparatus cut along a line III-III of FIGS. 2A and 2B.

Referring to FIGS. 2A, 2B, and 3, a plurality of subpixels P1, P2, and P3 and a subpixel circuit including a thin film transistor 300, a capacitor (not shown), and the wiring (not shown) used to drive the plurality of subpixels P1, P2, and P3 are formed in the light emission area AA.

The plurality of subpixels P1, P2, and P3 are disposed in rows and columns, and the subpixels P1, P2, and P3 that each emit light of a certain color, respectively, may be arranged in a first direction (direction D1). For example, as illustrated in FIGS. 2A and 2B, red subpixels P1, green subpixels P2, and blue subpixels P3 may be respectively arranged in rows R1, R2, and R3 formed in the first direction D1. Although not illustrated, the row R1 formed by the red subpixels P1, the row R2 formed by the green subpixels P2, and the row R3 formed by the blue subpixels P3 may be alternately arranged in a second direction (direction D2) that is substantially perpendicular to the first direction.

Each of the subpixels P1, P2, and P3 formed in the light emission area AA includes a first electrode 210, emission layers 220R, 220G, and 220B, a common layer 230, and a second electrode 240, as illustrated in FIG. 3.

The first electrode 210 is a pixel electrode and may be patterned to be formed in each of the subpixels P1, P2, and P3. The second electrode 240 is a common electrode and may be formed to correspond to the light emission area AA. As illustrated in FIGS. 2A, 2B, and 3, the second electrode 240 may be smaller than the substrate 100 but larger than the light emission area AA so as to cover the plurality of subpixels P1, P2, and P3 formed in the light emission area AA.

The emission layers 220R, 220G, and 220B may include organic materials that respectively emit red light, green light, and blue light for subpixels P1, P2, and P3, respectively. According to an exemplary embodiment, as illustrated in FIG. 2A, a red emission layer 220R is formed in the first direction to correspond to the row R1 of the red subpixels P1 arranged in the first direction, and a green emission layer 220G is formed in the first direction to correspond to the row R2 of the green subpixels 220G arranged in the first direction, and a blue emission layer 220B may be formed in the first direction to correspond to the row R3 of the blue subpixels P3 arranged in the first direction. According to another exemplary embodiment, as illustrated in FIG. 2B, red emission layers 220R may be formed in the first direction to respectively correspond to the red subpixels P1 arranged in the first direction. Green emission layers 220G may be formed in the first direction to respectively correspond to the green subpixels P2 arranged in the first direction, and blue emission layers 220B may be formed in the first direction to respectively correspond to the blue subpixels P3 arranged in the first direction. The red emission layers 220R, the green emission layers 220G, and the blue emission layers 220B may be each arranged to form a row in the first direction, and the row of the red emission layers 220R, the row of the green emission layers 220G, and the row of the blue emission layers 220B may be alternately disposed in the second direction.

The common layer 230 may include at least one of a hole transporting layer, a hole injection layer, an electron transport layer, and an electron injection layer. The common layer 230 may be formed to cover a plurality of subpixels P1, P2, and P3. For example, the common layer 230 may be larger than the light emission area AA and smaller than the second electrode 240, as illustrated in FIGS. 2A, 2B, and 3. The common layer 230 may be formed to cover a plurality of dummy emission layers 221R, 221G, and 221B and 222R, 222G, and 222B included in a dummy area DA.

The non-emission area NA includes a dummy area DA and a contact area CA. The plurality of dummy emission layers 221R, 221G, and 221B and 222R, 222G, and 222B are disposed in the dummy area DA, and the second electrode 240 and a cathode contact portion C-CNT, to which a driving power line 140 is connected, through which power ELVSS (−6V, for example) is supplied to the second electrode 240, are disposed in the contact area CA.

The plurality of dummy emission layers 221R, 221G, and 221B and 222R, 222G, and 222B formed in the dummy area DA include red dummy emission layers 221R and 222R, green dummy emission layers 221G and 222G, and blue dummy emission layers 221B and 222B. The red, green, and blue dummy emission layers 221R, 221G, and 221B and 222R, 222G, and 222B respectively include the same materials as those of the emission layers 220R, 220G, and 220*b* included in the red, blue, and green subpixels P1, P2, and P3. However, unlike the emission layers 220R, 220G, and 220B disposed in the subpixels P1, P2, and P3, the dummy emission layers 221R, 221G, and 221B and 222R, 222G, and 222B do not emit light.

The dummy emission layers 221R, 221G, and 221B and 222R, 222G, and 222B may extend in the first direction to form lines, respectively.

According to an embodiment, as illustrated in FIG. 2A, the red dummy emission layers 221R and 222R, the green dummy emission layers 221G and 222G, and the blue dummy emission layers 221B and 222B may extend in the first direction so as to form lines, respectively. In this example, the red dummy emission layers 221R and 222R extending in the first direction may each form a line L1, the green dummy emission layers 221G and 222G extending in the first direction may each form a line L2, and the blue dummy emission layers 221B and 222B extending in the first direction may each form a line L3. The lines L1 of the red dummy emission layers 221R and 222R, the lines L2 of the green dummy emission layers 221G and 222G, and the lines L3 of the blue dummy emission layers 221B and 222B may be alternately disposed in the second direction.

According to another embodiment, referring to FIG. 2B, pieces of red dummy emission layers 221R and 222R, pieces of green dummy emission layers 221G and 222G, and pieces of blue dummy emission layers 221B and 222B may be respectively spaced apart from one another and respectively arranged in the first direction to form lines. In this example, pieces of the red dummy emission layers 221R and 222R may be spaced apart from one another and arranged in a line L1 formed in the first direction, pieces of the green dummy emission layers 221G and 222G may be spaced apart from one another and arranged in a line L2 formed in the first direction, and pieces of the blue dummy emission layers 221B and 222B may be spaced apart from one another and arranged in a line L3 formed in the first direction. The lines L1 of the red dummy emission layers 221R and 222R, the lines L2 of the green dummy emission layers 221G and 222G, and the lines L3 of the blue dummy emission layers 221B and 222B may be alternately disposed in the second direction.

The red, green, and blue dummy emission layers 221R, 221G, and 221B and 222R, 222G, and 222B of the organic light-emitting display apparatus according to the present embodiment are respectively formed in a deposition operation of the red, green, and blue emission layers 220R, 220G, and 220B included in the subpixels P1, P2, and P3. A deposition mask 10 as illustrated in FIG. 4A or a deposition mask 10' as illustrated in FIG. 4B may be used in a deposition operation as part of manufacturing the display apparatus.

Figure 4A:
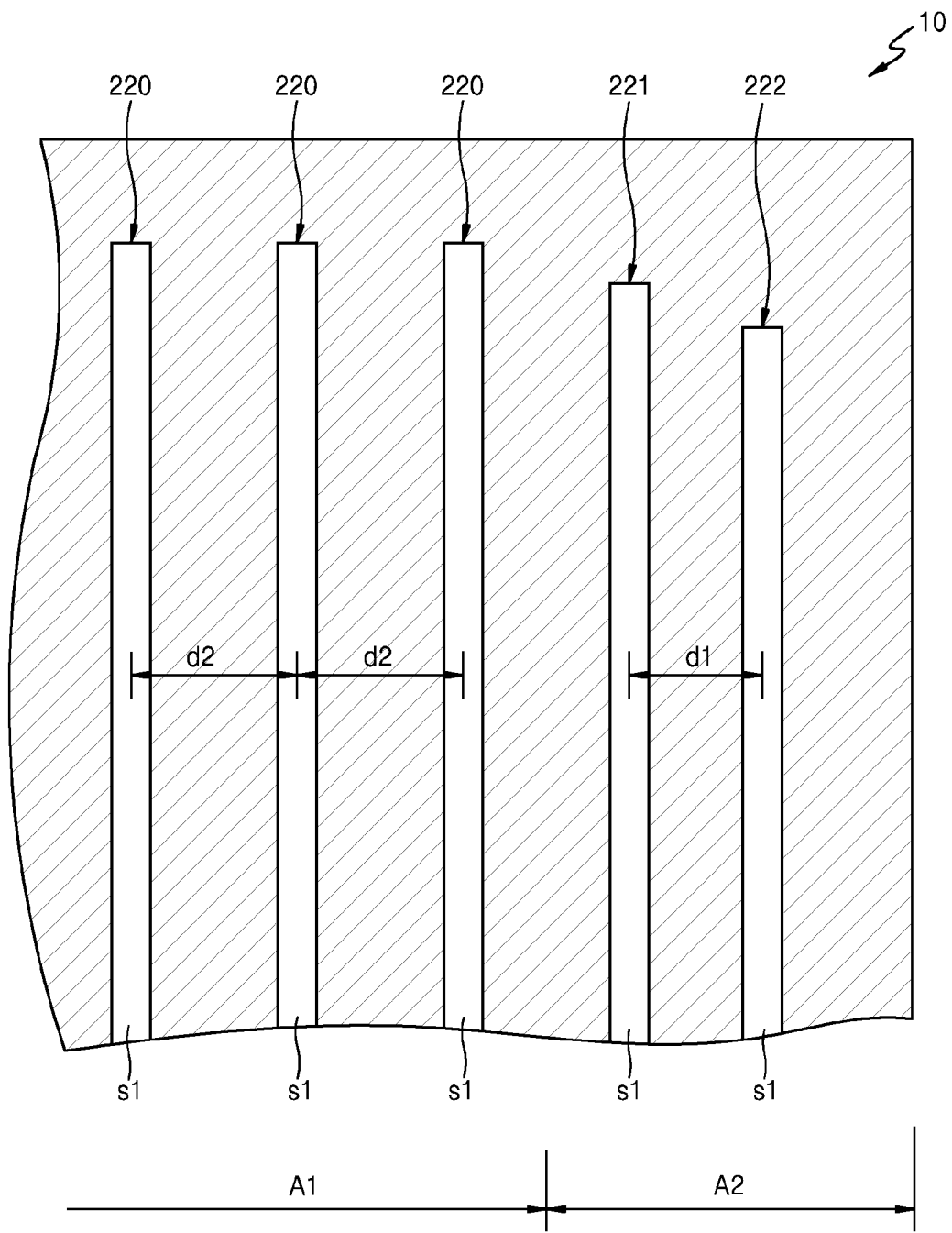
FIG. 4A is a plan view illustrating a portion of a deposition mask for an organic light-emitting display apparatus according to an exemplary embodiment.
Figure 4B:
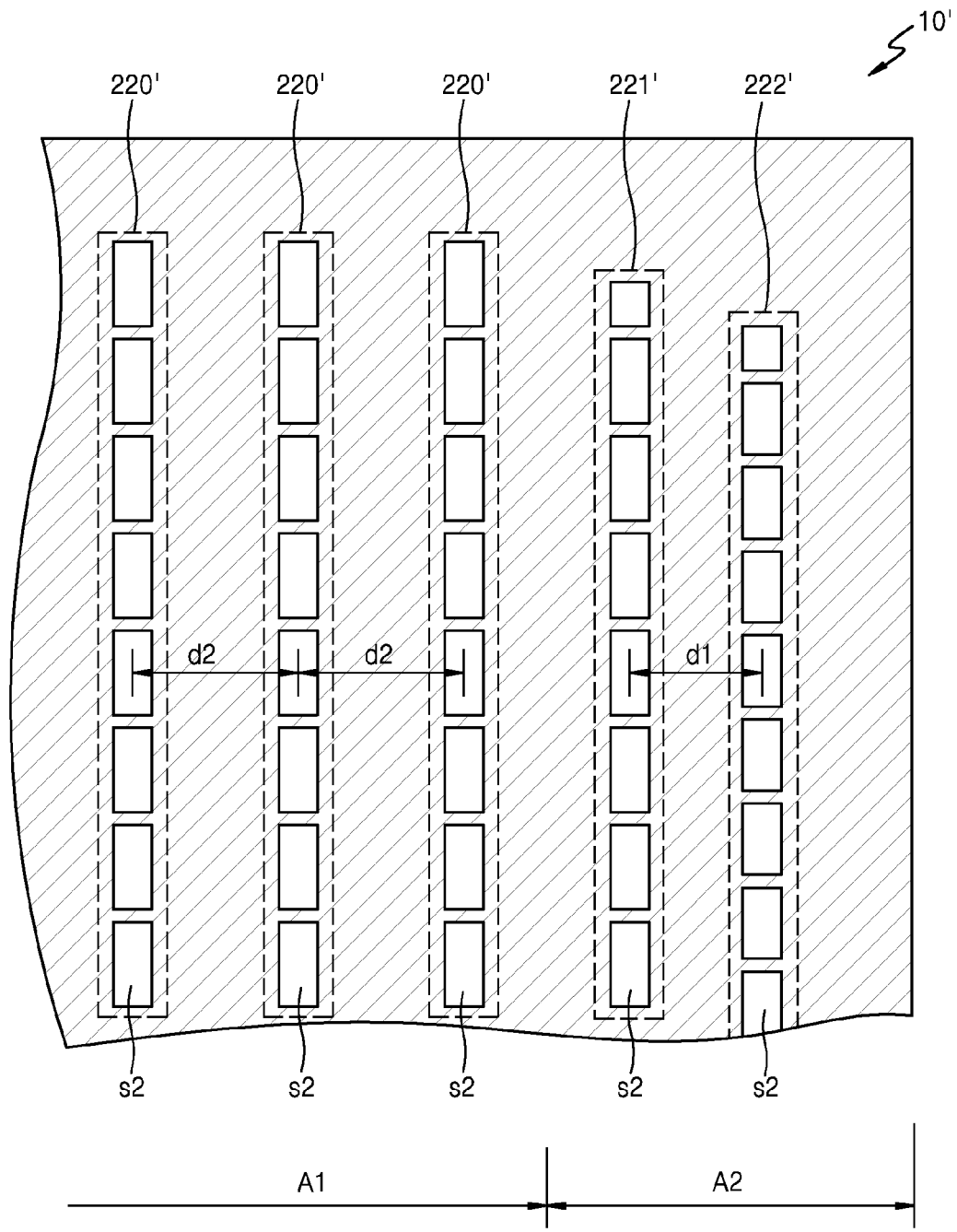
FIG. 4B is a plan view illustrating a portion of a deposition mask for an organic light-emitting display apparatus according to another exemplary embodiment.

FIG. 4A is a plan view illustrating a portion of a deposition mask 10 for an organic light-emitting display apparatus according to an embodiment, and FIG. 4B is a plan view illustrating a portion of a deposition mask 10' for an organic light-emitting display apparatus according to another embodiment.

Referring to FIGS. 4A and 4B, the deposition masks 10 and 10' according to embodiments include effective opening portions 220 and 220' formed in a first area A1 corresponding to the light emission area AA and dummy opening portions 221, 222, 221', and 222' formed in a second area A2 of the non-emission area NA corresponding to the dummy area DA. The deposition masks 10 and 10' are used to deposit the emission layers 220R, 220G, and 220B in the subpixels P1, P2, and P3 included in the light emission area AA, and in the organic light-emitting display apparatus, light is emitted from the emission layers 220R, 220G, and 220B deposited by using the effective opening portions 220 and 220'. If the deposition masks 10 and 10' that include only the effective openings are used, it has been found that the deposition masks 10 and 10' sag due to weight thereof, and it becomes difficult to deposit the emission layers 220R, 220G, and 220B at exact positions. The deposition masks 10 and 10' sag further as a size of the organic light-emitting display apparatus increases. However, according to the embodiments, the sagging of the deposition masks 10 and 10' may be prevented or reduced by further including the dummy opening portions.

Referring to FIG. 4A, the effective opening portions 220 and the dummy opening portions 221 and 222 are slit patterns s1 extending in the first direction and may be spaced from one another in the second direction.

When an organic light-emitting display apparatus includes red, green, and blue subpixels P1, P2, and P3 according to an embodiment, three deposition masks 10 as illustrated in FIG. 4A may respectively be used to form the red, green, and blue emission layers 220R, 220G, and 220B, 221R, 221G, and 221B, 222R, 222G, and 222B as illustrated in FIG. 2A.

The red emission layer 220R and the red dummy emission layers 221R and 222R included in the red subpixel P1 may be formed by using the deposition mask 10 as illustrated in FIG. 4A. Also, the green emission layer 220G and the green dummy emission layers 221G and 222G included in the green subpixel P2 may be formed by using the deposition mask 10 as illustrated in FIG. 4A. Also, the blue emission layer 220B and the blue dummy emission layers 221B and 222B included in the green subpixel P3 may be formed by using the deposition mask 10 as illustrated in FIG. 4A.

Although the effective opening portion 220 and the dummy opening portions 221 and 222 of the deposition mask 10 described with reference to FIG. 4A include the slit patterns s1, the embodiments are not limited thereto. According to another embodiment, the effective opening portions 220' and the dummy opening portions 221' and 222' of the deposition mask 10' may include slot patterns s2 as illustrated in FIG. 4B.

Referring to FIG. 4B, the effective openings 220' and the dummy openings 221' and 222' include a plurality of slot patterns s2 that are spaced from one another in the first direction, and the effective opening portions 220' and the dummy openings 221' and 222' are spaced from one another in the second direction. Although the slot patterns s2 of the dummy opening portions 221' and 222' have the same shape as the slot patterns s2 of the effective opening portions 220' in FIG. 4B, the embodiments are not limited thereto, and the slot patterns s2 of the dummy opening portions 221' and 222' may be formed in various shapes, for example, in a circular, oval, or polygonal shape.

According to another embodiment, if an organic light-emitting display apparatus includes red, green, and blue subpixels P1, P2, and P3, three sheets of the deposition mask 10' as illustrated in FIG. 4B may be used to form each of the red, green, and blue emission layers 220R, 220G, and 220B, 221R, 221G, and 221B, 222R, 222G, and 222B as illustrated in FIG. 2B.

The red emission layer 220R and the red dummy emission layers 221R and 222R included in the red subpixel P1 may be formed by using the deposition mask 10' as illustrated in FIG. 4B. Also, the green emission layer 220G and the green dummy emission layers 221G and 222G included in the green subpixel P2 may be formed by using the deposition mask 10' as illustrated in FIG. 4B. Likewise, the blue emission layer 220B and the blue dummy emission layers 221B and 222B included in the green subpixel P3 may be formed by using the deposition mask 10' as illustrated in FIG. 4B.

As described above, as the deposition masks 10 and 10' according to the embodiments include the dummy opening portions 221, 222, 221', and 222', sagging of the deposition masks 10 and 10' may be prevented or reduced. However, if the dummy opening portions 221, 222, 221', and 222' are at relatively large distances, an area of the dummy emission layers 221R, 221G, 221B, 222R, 222G, and 222B formed by the dummy opening portions 221, 222, 221', and 222' is increased, and thus the non-emission area NA is also increased.

However, according to the embodiments, a distance d1 between adjacent dummy opening portions 221, 222, 221', and 222' is smaller than a distance d2 between adjacent effective opening portions 220 and 220'. Thus, the organic light-emitting display apparatus formed by using the deposition masks 10 and 10' according to the embodiments may reduce an area of the dummy emission layers 221R, 221G, and 221B, and 222R, 222G, and 222B.

When forming emission layers and dummy emission layers of subpixels by using the deposition masks 10 and 10' according to the embodiments, the distance d1 between the dummy emission layers 221R, 221G, and 221B, and 222R, 222G, and 222B having the same color from among the dummy emission layers 221R, 222R, or 221G, 222G, or 221B, 222B formed in the dummy area DA is smaller than the distance d2 between the subpixels P1, P2, and P3 that are formed in the light emission area AA and emit light of the same color. Accordingly, an area of the dummy emission layers 221R, 221G, and 221B, 222R, 222G, and 222B may be reduced, and an area of the non-emission area NA may be minimized, and a sufficient contact area of the cathode contact portion C-CNT may be provided.

Referring to FIG. 3 again, the second electrode 240 extends up to the non-emission area NA to cover the dummy emission layers 221R, 221G, and 221B, 222R, 222G, and 222B. An end of the second electrode 240 may pass the dummy area DA and extend up to the contact area CA to be electrically connected to a driving voltage line 140 through which power ELVSS is supplied to the second electrode 240, thereby forming the cathode contact portion C-CNT. For example, the second electrode 240 and the driving voltage line 140 may be electrically connected to each other with a contact layer 215 therebetween.

While FIG. 3 illustrates the dummy emission layers 221R, 221G, and 221B, 222R, 222G, and 222B that have different colors and are spaced apart from one another, the embodiments are not limited thereto. According to another embodiment, dummy emission layers having the same color are disposed at a predetermined distance d1 while dummy emission layers, 221G, and 221B, 222R, 222G, and 222B having different colors may be overlapped with one another. In this case, an area of the dummy area DA may be further reduced.

Figure 5:
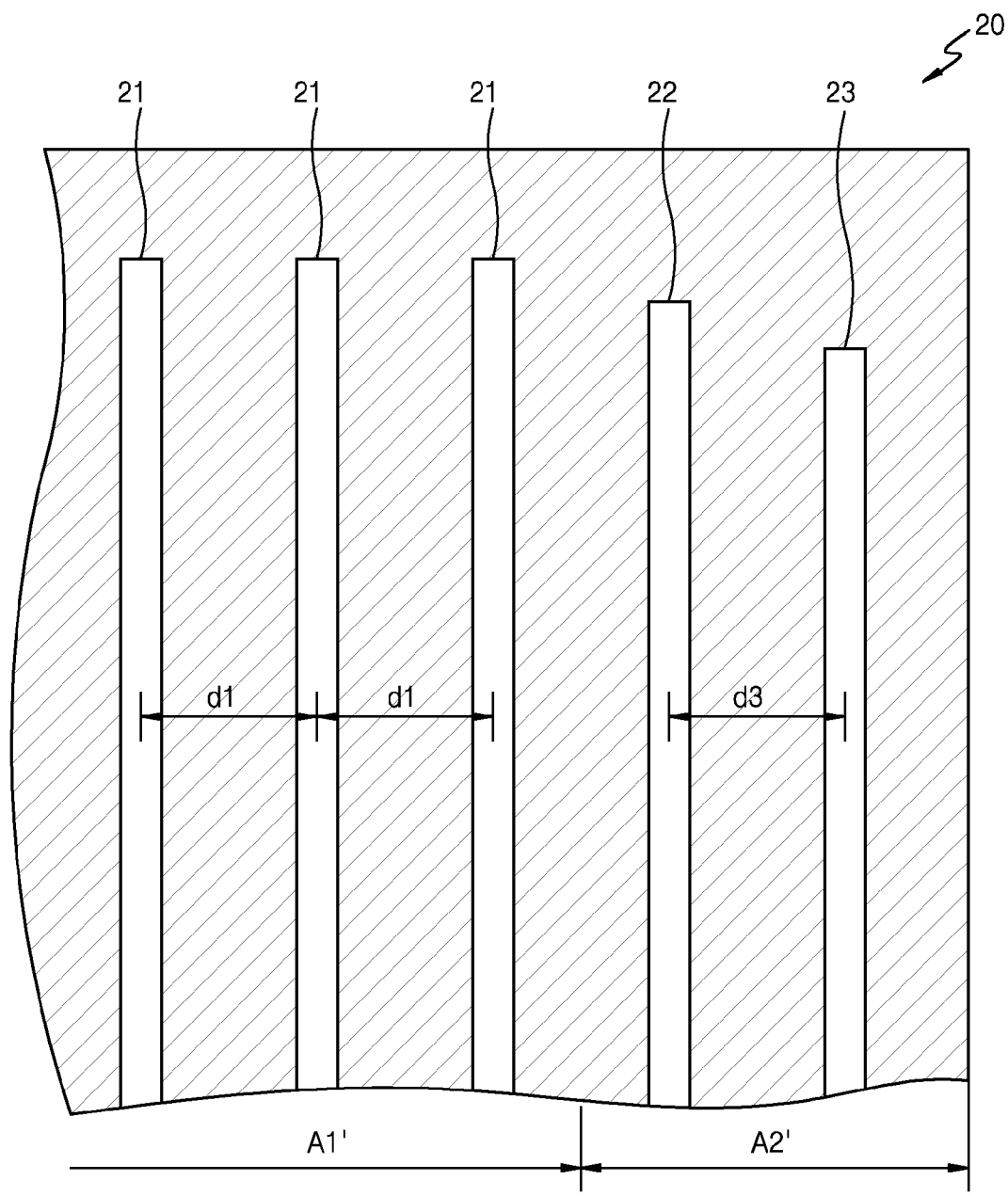
FIG. 5 is a plan view illustrating a portion of a deposition mask for an organic light-emitting display apparatus according to a comparative example.
Figure 6:
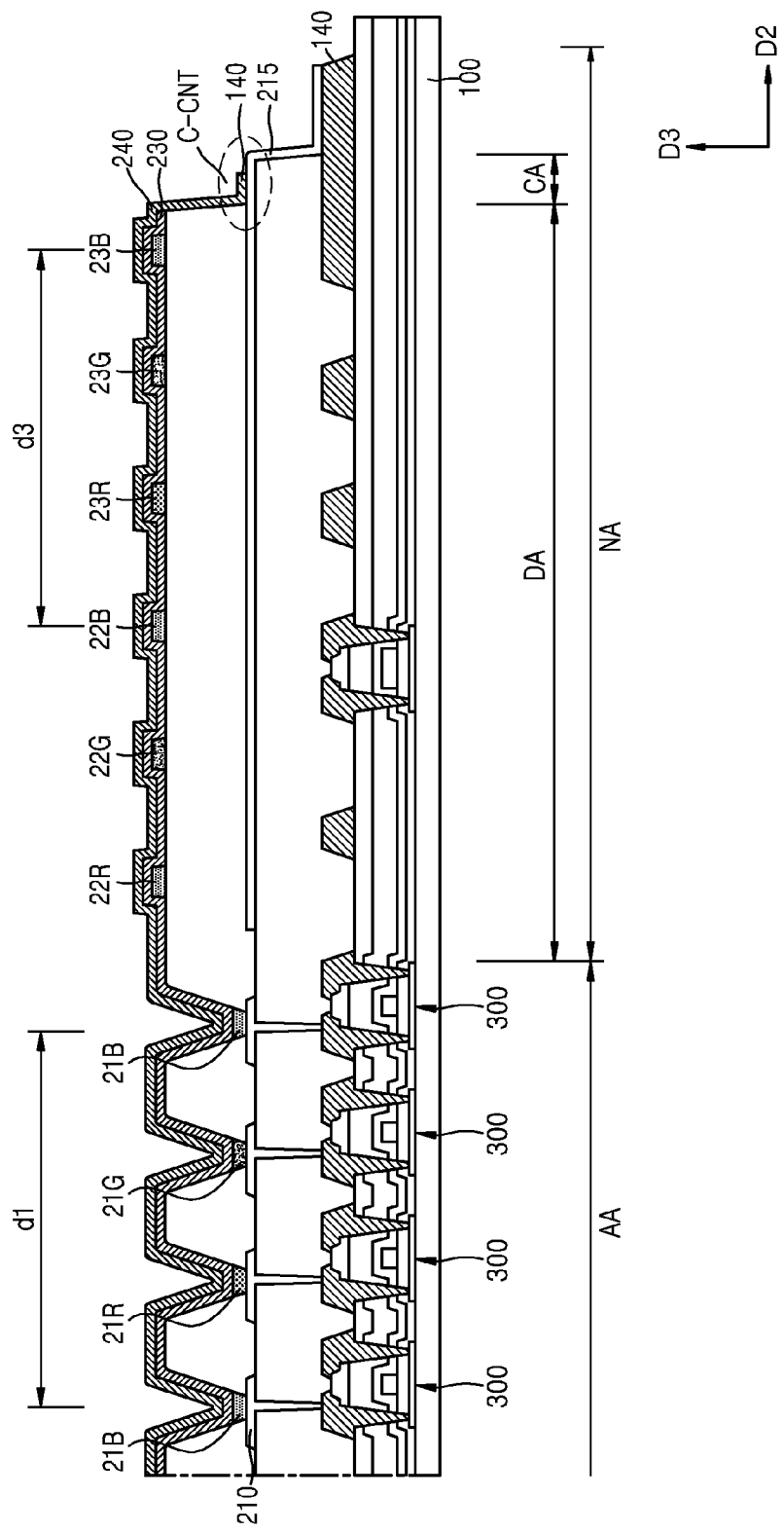
FIG. 6 is a cross-sectional view illustrating an organic light-emitting display apparatus according to a comparative example.

FIG. 5 is a plan view illustrating a portion of a deposition mask 20 for an organic light-emitting display apparatus according to a comparative example, and FIG. 6 is a cross-sectional view illustrating an organic light-emitting display apparatus according to a comparative example.

As illustrated in FIG. 5, a distance d3 between dummy opening portions 22 and 23 formed in a second area A2' corresponding to the non-emission area NA in the deposition mask 20 according to the comparative example is equal to a distance d1 between effective opening portions 21 formed in a first area A1' corresponding to a light emission area AA.

In the organic light-emitting display apparatus formed by using the deposition mask 20 according to the comparative example, as the distance d3 between dummy emission layers 22R, 23R, or 22G, 23G, or 22B, 23B of the same color is relatively broad as illustrated in FIG. 6, an area of the dummy area DA in the non-emission area NA is relatively large, and an area of the cathode contact portion C-CNT is inevitably reduced. Thus, it is difficult to provide a sufficient contact area between the second electrode 240 and the driving voltage line 140. To solve this problem, a contact area between the second electrode 240 and the contact layer 215 may be increased but then the area of the non-emission area NA is increased.

In contrast, according to the organic light-emitting display apparatus of the present embodiment, the deposition masks 10 and 10' are used, in which the distance d1 between the dummy opening portions 221, 222, 221', and 222' is smaller than the distance d2 between the effective opening portions 220 and 220'. As a result, an area of the dummy area DA may be reduced, a cathode contact portion C-CNT having a sufficient area may be provided, and the non-emission area NA may be reduced.

As described above, according to the one or more of the above exemplary embodiments, a cathode contact portion having a sufficient area may be provided in an organic light-emitting display apparatus and a deposition mask for the organic light-emitting display apparatus. Furthermore, an area of a non-emission area (i.e., the bezel area) may be reduced. Of course, the scope of the inventive concept is not restricted by this effect.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting display apparatus comprising:
    a substrate comprising a light emission area and a non-emission area disposed in an outer portion adjacent the light emission area;
    a plurality of subpixels disposed in the light emission area of the substrate and comprising a first electrode, an emission layer, and a second electrode, wherein the plurality of subpixels are configured to respectively emit light of different colors; and
    a plurality of dummy emission layers that are disposed in the non-emission area of the substrate and are of different colors,
    wherein a first distance between adjacent first dummy emission layers of a first color with a second dummy emission layer therebetween, from among the plurality of dummy emission layers is smaller than a second distance between adjacent first subpixels that emit light of the first color with a second subpixel therebetween, from among the plurality of subpixels, and the second dummy emission layer has a second color different from the first color and the second subpixel emits light of the second color.

2. The organic light-emitting display apparatus of claim 1, wherein the plurality of subpixels comprise:
    a first row arranged in a first direction and comprising a plurality of subpixels that emit light of the first color; and
    a second row arranged in the first direction, the second row disposed adjacent the first row and comprising a plurality of subpixels that emit light of the first color,
    wherein the second row is spaced apart from the first row by the second distance in a second direction that is substantially perpendicular to the first direction.

3. The organic light-emitting display apparatus of claim 2, further comprising a third row arranged in the first direction and disposed between the first row and the second row, the third row comprising a plurality of subpixels that emit light of a second color that is different from the first color.

4. The organic light-emitting display apparatus of claim 1, wherein the plurality of dummy emission layers comprise:
    a first line formed in a first direction and comprising at least one dummy emission layer having the first color; and
    a second line formed in the first direction, the second line disposed adjacent the first line and comprising at least one dummy emission layer having the first color,
    wherein the second line is spaced apart from the first line by the first distance in a second direction that is substantially perpendicular to the first direction.

5. The organic light-emitting display apparatus of claim 4, further comprising a third line formed in the first direction, the third line disposed between the first line and the second line and comprising a dummy emission layer of a second color different from the first color.

6. The organic light-emitting display apparatus of claim 1, wherein the second electrode extends over a portion of the non-emission area to cover the plurality of dummy emission layers.

7. The organic light-emitting display apparatus of claim 1, further comprising:
   a cathode contact portion; and
   a driving power line,
   wherein an end portion of the second electrode and the driving power line are electrically connected to the cathode contact portion, and
   wherein the driving power line is configured to apply power to the second electrode.

8. The organic light-emitting display apparatus of claim 7, wherein the cathode contact portion further comprises a contact layer,
   wherein the contact layer contacts the second electrode and the driving power line, and
   wherein the contact layer electrically connects the second electrode and the driving power line.

9. The organic light-emitting display apparatus of claim 1, further comprising a common layer interposed between the first electrode and the second electrode.

10. The organic light-emitting display apparatus of claim 9, wherein the common layer is larger than the light emission area and is smaller than the second electrode.

11. A deposition mask for manufacturing an organic light-emitting display apparatus, the deposition mask comprising:
   a plurality of effective opening portions that correspond to a plurality of first subpixel regions of a light emission area and are disposed in parallel to one another; and
   a plurality of dummy opening portions that correspond to a non-emission area included in an outer portion adjacent the light emission area and that are disposed in parallel to one another,
   wherein a first distance between adjacent dummy opening portions from among the dummy opening portions is smaller than a second distance between adjacent effective opening portions from among the effective opening portions, and
   the deposition mask covers a plurality of second subpixel regions between the adjacent effective opening portions.

12. The deposition mask of claim 11, wherein each of the adjacent effective opening portions includes a slit pattern extending in a first direction, and
   the adjacent effective opening portions are spaced apart from one another by the second distance in a second direction that is substantially perpendicular to the first direction.

13. The deposition mask of claim 11, wherein each of the adjacent effective opening portions includes a plurality of slot patterns arranged a first direction, and
   the adjacent effective opening portions are spaced apart from one another by the second distance in a second direction that is substantially perpendicular to the first direction.

14. The deposition mask of claim 11, wherein each of the adjacent dummy opening portions includes a slit pattern extending in a first direction, and
   the adjacent dummy opening portions are spaced apart from one another by the first distance in a second direction that is substantially perpendicular to the first direction.

15. The deposition mask of claim 11, wherein each of the adjacent dummy opening portions includes a plurality of slot patterns arranged in a first direction, and
   the adjacent dummy opening portions are spaced apart from one another by the first distance in a second direction that is substantially perpendicular to the first direction.

* * * * *